US009487669B2

(12) United States Patent
McCullough et al.

(10) Patent No.: US 9,487,669 B2
(45) Date of Patent: Nov. 8, 2016

(54) METAL ALLOYS FROM MOLECULAR INKS

(75) Inventors: Richard D. McCullough, Pittsburgh, PA (US); John Belot, Rayland, OH (US); Rebecca Potash, Duxbury, MA (US)

(73) Assignee: LIQUID X PRINTED METALS, INC., Pittsburgh, PA (US)

( * ) Notice: Subject to any disclaimer, the term of this patent is extended or adjusted under 35 U.S.C. 154(b) by 1079 days.

(21) Appl. No.: 13/464,605

(22) Filed: May 4, 2012

(65) Prior Publication Data

US 2012/0304889 A1 Dec. 6, 2012

Related U.S. Application Data

(60) Provisional application No. 61/482,571, filed on May 4, 2011.

(51) Int. Cl.
| | | |
|---|---|---|
| *H01B 1/02* | (2006.01) | |
| *C09D 11/52* | (2014.01) | |
| *H05K 1/09* | (2006.01) | |

(Continued)

(52) U.S. Cl.
CPC ................ *C09D 11/52* (2013.01); *H05K 1/092* (2013.01); *H05K 3/1283* (2013.01); *H01B 1/02* (2013.01); *H05K 3/105* (2013.01); *H05K 2203/1476* (2013.01)

(58) Field of Classification Search
CPC .......................................................... H01B 1/02
USPC ........................................................ 252/514
See application file for complete search history.

(56) References Cited

U.S. PATENT DOCUMENTS

| 4,097,414 A | 6/1978 | Cavitt |
| 4,102,820 A | 7/1978 | Cavitt |

(Continued)

FOREIGN PATENT DOCUMENTS

| CN | 1901128 A | 1/2007 |
| CN | 101142674 A | 3/2008 |

(Continued)

OTHER PUBLICATIONS

Cotton, F. Albert and Wilkinson, Geoffrey, Advanced Inorganic Chemistry: A Comprehensive Text, 4th Edition, 1980, John Wiley, Table of Contents.

(Continued)

*Primary Examiner* — William Young
(74) *Attorney, Agent, or Firm* — The Marbury Law Group, PLLC

(57) ABSTRACT

Low temperature processes for converting mixtures of metal inks into alloys. The alloys can be dealloyed by etching. A method comprising: depositing at least one precursor composition on at least one substrate to form at least one deposited structure, wherein the precursor composition comprises at least two metal complexes, including at least one first metal complex comprising at least one first metal and at least one second metal complex different from the first metal complex and comprising at least one second metal different from the first metal, treating the deposited structure so that the first metal and the second metal form elemental forms of the first metal and the second metal in a treated structure. Further, one can remove at least some of the first metal to leave a nanoporous material comprising at least the second metal. Precursor compositions can be formulated to be homogeneous compositions.

24 Claims, 9 Drawing Sheets

(51) Int. Cl.
*H05K 3/12* (2006.01)
*H05K 3/10* (2006.01)

(56) References Cited

U.S. PATENT DOCUMENTS

| | | | |
|---|---|---|---|
| 4,266,011 | A | 5/1981 | Jan |
| 4,410,538 | A | 10/1983 | Hamprecht et al. |
| 4,619,970 | A | 10/1986 | Okamoto et al. |
| 4,758,588 | A | 7/1988 | Brown et al. |
| 4,939,114 | A | 7/1990 | Nojiri et al. |
| 4,977,038 | A | 12/1990 | Sieradzki et al. |
| 5,041,640 | A | 8/1991 | Creger |
| 5,585,457 | A | 12/1996 | Newkome et al. |
| 5,703,254 | A * | 12/1997 | Gaffney .............. C07D 301/10 549/536 |
| 5,955,141 | A | 9/1999 | Soutar et al. |
| 6,010,969 | A | 1/2000 | Vaartstra |
| 6,491,803 | B1 | 12/2002 | Shen et al. |
| 6,620,971 | B2 | 9/2003 | Chang et al. |
| 6,805,972 | B2 | 10/2004 | Erlebacher et al. |
| 6,951,666 | B2 | 10/2005 | Kodas et al. |
| 7,001,526 | B1 | 2/2006 | Tin |
| 7,270,694 | B2 | 9/2007 | Li et al. |
| 7,443,027 | B2 | 10/2008 | Wu et al. |
| 7,491,646 | B2 | 2/2009 | Wu et al. |
| 7,494,608 | B2 | 2/2009 | Li et al. |
| 7,553,512 | B2 | 6/2009 | Kodas et al. |
| 7,608,203 | B2 | 10/2009 | Okada et al. |
| 7,893,006 | B2 | 2/2011 | Huang et al. |
| 2003/0026959 | A1 | 2/2003 | Furuse et al. |
| 2003/0124259 | A1 | 7/2003 | Kodas et al. |
| 2003/0124457 | A1 | 7/2003 | Jung et al. |
| 2003/0148024 | A1* | 8/2003 | Kodas et al. .................. 427/125 |
| 2003/0161959 | A1 | 8/2003 | Kodas et al. |
| 2003/0207568 | A1 | 11/2003 | Byun et al. |
| 2003/0216246 | A1 | 11/2003 | Cook et al. |
| 2006/0045960 | A1 | 3/2006 | Furuse et al. |
| 2006/0130700 | A1 | 6/2006 | Reinartz |
| 2007/0104870 | A1 | 5/2007 | Kodas et al. |
| 2008/0255379 | A1* | 10/2008 | Grey .................... C07D 301/06 549/533 |
| 2008/0294802 | A1 | 11/2008 | Kohinata et al. |
| 2008/0305268 | A1 | 12/2008 | Norman et al. |
| 2009/0188556 | A1 | 7/2009 | Castillo et al. |
| 2010/0163810 | A1 | 7/2010 | Ginley et al. |
| 2011/0111138 | A1 | 5/2011 | McCullough et al. |
| 2013/0236656 | A1 | 9/2013 | McCullough et al. |

FOREIGN PATENT DOCUMENTS

| | | |
|---|---|---|
| JP | 2011-34750 | 2/2011 |
| WO | WO-2004/020064 A2 | 3/2004 |

OTHER PUBLICATIONS

Cotton, F. Albert, Chemical Applications of Group Theory, 3rd Edition, 1990, Wiley-Interscience, Table of Contents.

Piqué et al., Direct Write Technologies for Rapid Prototyping Applications: Sensors, Electronics, and Integrated Power Sources, 2002, Academic Press, Table of Contents.

Lukehart, Charles M., Fundamental Transition Metal Organometallic Chemistry, 1985, Brooks/Cole, Table of Contents.

Madou, Marc J., Fundamentals of Microfabrication, The Science of Miniaturization, Second Edition, 2002, CRC Press, Table of Contents.

Metals Handbook, 9th Edition. vol. 2: Properties & Selection: Nonferrous Alloys and Pure Metals, American Society for Metals, Metals Park, Ohio, 1979, Table of Contents.

Shackelford, James F., Introduction to Materials Science for Engineers, 4th Edition, 1996, Prentice Hall, Table of Contents.

Smith, Michael B. and March, Jerry, March's Advanced Organic Chemistry: Reactions, Mechanisms, and Structure, 6th Edition, Jan. 2007, Wiley, Table of Contents.

International Search Report and Written Opinion mailed Sep. 10, 2012 in corresponding International Application No. PCT/US2012/036549.

* cited by examiner

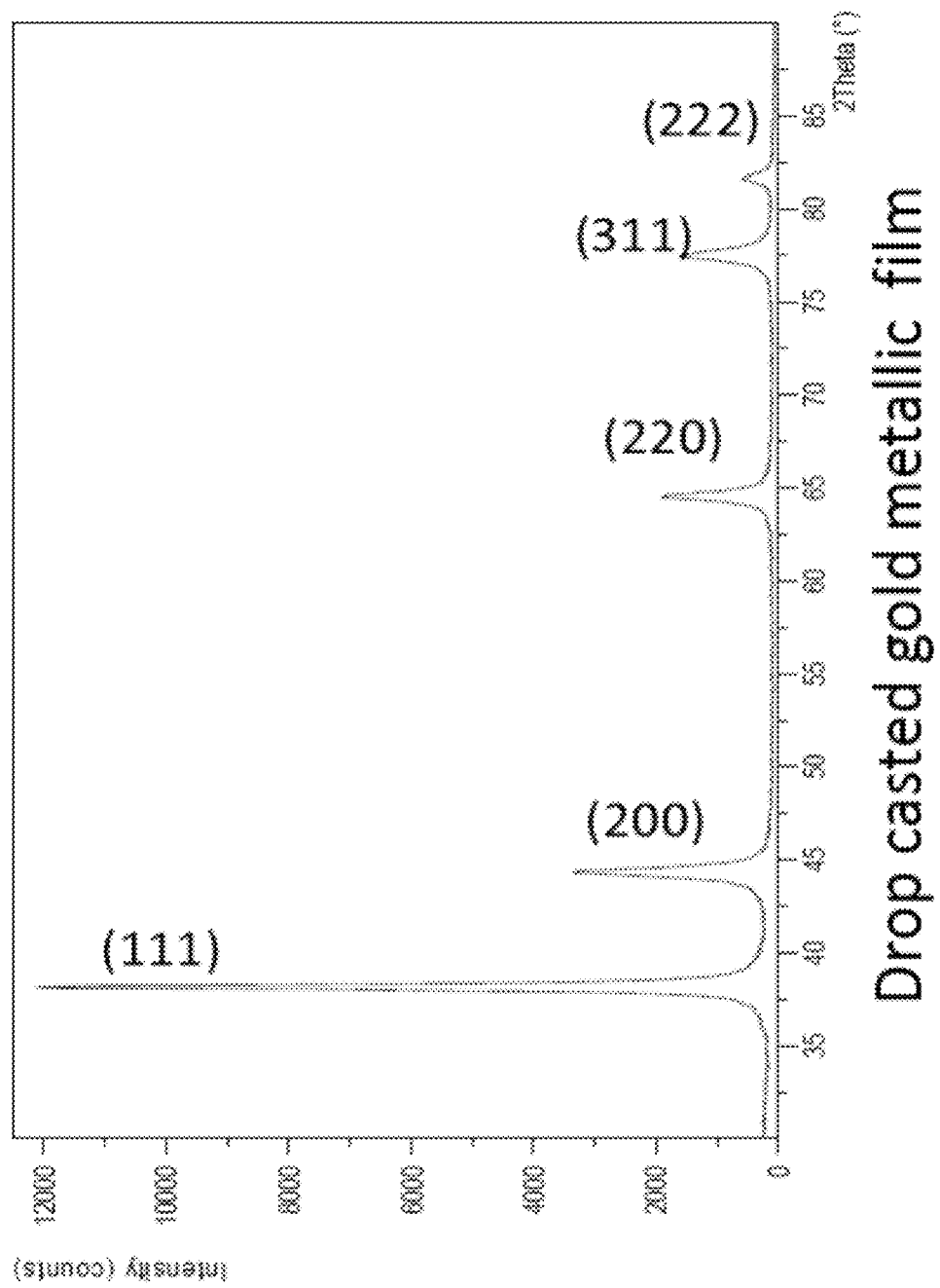

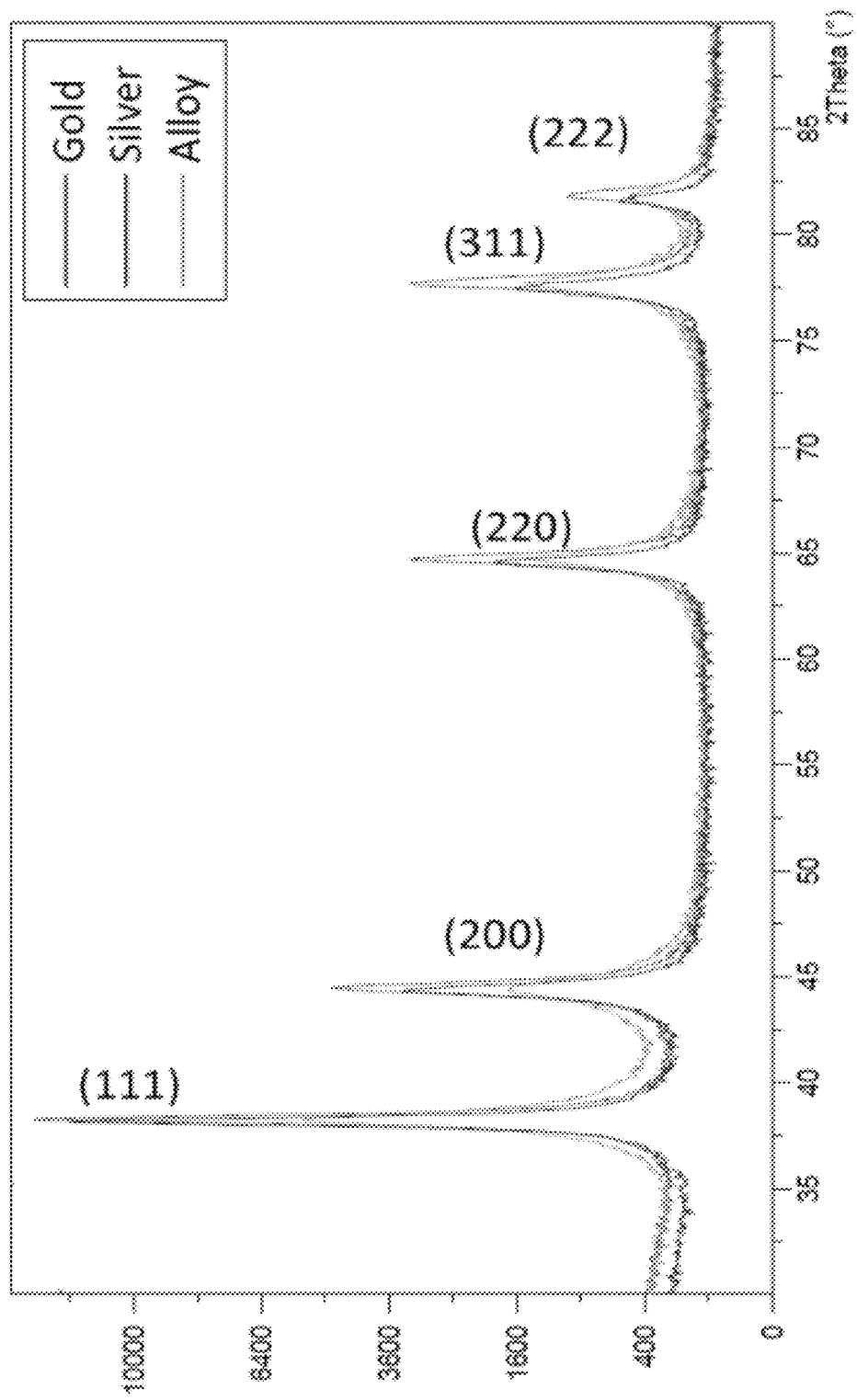

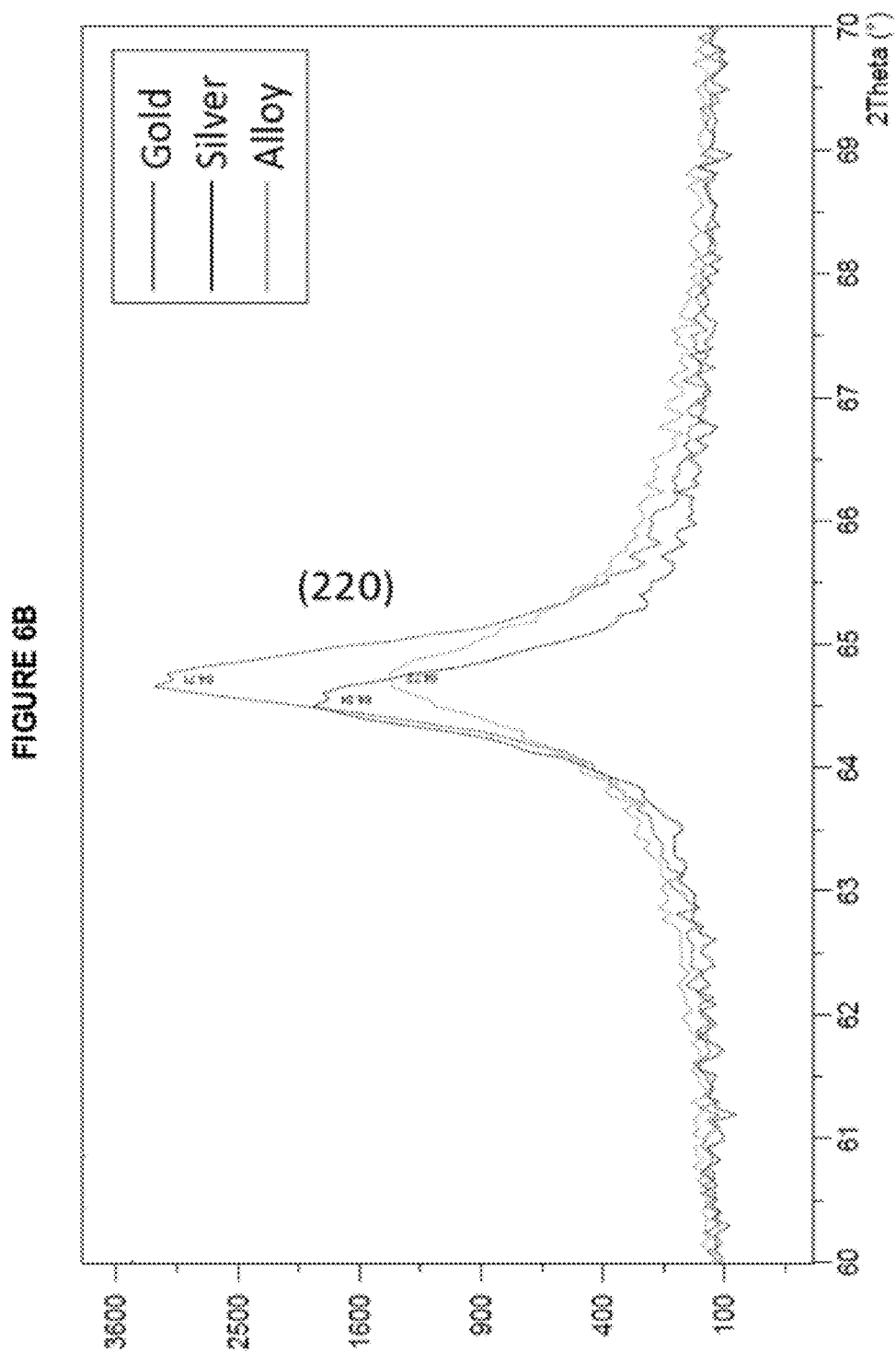

METAL ALLOYS FROM MOLECULAR INKS

RELATED APPLICATIONS

This application claims priority to U.S. provisional Ser. No. 61/482,571 filed May 4, 2011 which is incorporated herein by reference in its entirety.

BACKGROUND

Printed electronics is projected to be a multi-billion dollar business within the next 7-10 years, with the inks alone constituting 10-15% of that amount, according to some sources. More particularly, a need exists for better methods of printing metals such as, for example, copper, silver, and gold. These metals are important chip components ranging from interconnects to organic field effect transistor source and drain electrodes. In general, improved compositions and methods for producing metal structures are needed, particularly for commercial applications and inkjet printing. See, for example, U.S. Pat. Nos. 7,270,694; 7,443,027; 7,491,646; 7,494,608 (assignee: Xerox); US Patent Publication 2010/0163810 ("Metal Inks"); US Patent Publication 2008/0305268 ("Low Temperature Thermal Conductive Inks"); and US Patent Publication 2006/0130700 ("Silver Containing Inkjet Inks").

Metal alloys are important to many areas of technology. However, printing mixtures of metals to form alloys can be difficult to achieve, especially from nanoparticles, as inhomogeneities can arise. Many alloys are prepared using high temperature processing and melting of the metals. A need exists for better, lower temperature methods and ink formulations for use in making alloys.

Furthermore, a need exists for better methods for preparing nanoporous metallic structures including thin films. See, for example, U.S. Pat. No. 6,805,972 (Erlebacher). Such materials can be used for applications ranging from, for example, heterogeneous catalysis to biological detection.

Other references are U.S. Patent Publication 2008/294, 802; and U.S. Pat. Nos. 7,893,006; 6,491,803; and 7,608,203.

SUMMARY

Provided herein are embodiments for compositions, devices, methods of making compositions and devices, and methods of using compositions and devices, among other embodiments.

For example, one embodiment provides a method comprising: depositing at least one precursor composition on at least one substrate to form at least one deposited structure, wherein the precursor composition comprises at least two metal complexes, including at least one first metal complex comprising at least one first metal and at least one second metal complex different from the first metal complex and comprising at least one second metal different from the first metal; treating the deposited structure so that the first metal and the second metal form elemental forms of the first metal and the second metal in a treated structure.

In one embodiment, the precursor composition is a homogeneous composition.

In one embodiment, the precursor composition is prepared by mixing at least one first metal complex and at least one second metal complex.

In one embodiment, the precursor composition is substantially free of metallic nanoparticles. In one embodiment, the precursor composition is free of metallic nanoparticles. In one embodiment, the precursor composition comprises metallic nanoparticles at a level of less than 0.1 wt. %.

In one embodiment, the first metal complex is a silver, gold, copper, platinum, iridium, or a rhodium complex. In one embodiment, the first metal complex is a silver complex. In one embodiment, the second metal complex is a silver, gold, copper, nickel, platinum, iridium, or a rhodium complex. In one embodiment, the second metal complex is a gold complex. In one embodiment, the precursor composition further comprises at least one third metal complex different from the first and second metal complexes and comprising at least one third metal different from the first and second metals. In one embodiment, for the precursor composition the atomic percent of the first metal is about 10% to about 90% and the atomic percent of the second metal is about 10% to about 90% relative to the total metal content. In one embodiment, more particularly, for the precursor composition the atomic percent of the first metal is about 20% to about 80% and the atomic percent of the second metal is about 20% to about 80% relative to the total metal content.

In one embodiment, both the first and the second metal are FCC metals. In another embodiment, both the first and the second metals are BCC metals.

In one embodiment, the precursor composition further comprises at least one solvent. In one embodiment, the precursor composition further comprises at least one solvent, wherein the solvent is a hydrocarbon. The hydrocarbon can be, for example, linear, branched, or aromatic.

In one embodiment, the amount of the first complex and the second complex relative to the total amount of precursor composition is about 500 mg/mL or less. In one embodiment, the amount of the first complex and the second complex relative to the total amount of precursor composition is about 250 mg/mL or less.

In one embodiment, the precursor composition has a viscosity adapted for use in ink jet printing for the depositing step. In one embodiment, for example, the precursor composition has a viscosity of about 100 cps or less at 25° C.

In one embodiment, the first metal complex and the second metal complex each comprise only one metal center. In one embodiment, the first metal of the first metal complex and the second metal of the second metal complex each are in an oxidation state of (I) or (II). In one embodiment, the first metal complex and the second metal complex are each neutral complexes. In one embodiment, the first metal complex comprises at least one carboxylate ligand. In one embodiment, the first metal complex comprises at least one multidentate amino ligand. The ligand can be, for example, unsymmetrical. In one embodiment, the first metal complex comprises at least one carboxylate ligand and at least one multidentate amino ligand. In one embodiment, the second metal complex comprises at least one carboxylate ligand. In one embodiment, the second metal complex comprises at least one sulfur-containing ligand. In one embodiment, the second metal complex comprises at least one carboxylate ligand and at least one sulfur-containing ligand, such as a thioether. In one embodiment, the depositing step comprises drop casting, spin coating, ink jet printing, roll-to-roll, slot-die, gravure, microcontact printing, or flexographic printing. In one embodiment, the depositing step comprises ink jet printing. In one embodiment, the depositing step is not carried out under a vacuum. In one embodiment, the depositing step does not comprise sputtering. In one embodiment, the depositing step does not comprise electrochemical deposition.

In one embodiment, the depositing step is carried out at least twice on the same position on the substrate. In one embodiment, the deposited structure is a line. In one embodiment, the substrate is flexible or rigid. In one embodiment, the substrate is a polymeric substrate. In one embodiment, the substrate is glass or a semiconductor material. In one embodiment, the treating step is a heating step or an exposure to radiation step. In one embodiment, the treated structure has a thickness of about 500 nm or less. In one embodiment, the treating step is a heating step at less than 250° C. In one embodiment, the treating step is a heating step at less than 200° C.

In one embodiment, the two elemental metals in the treated structure are in the form of an alloy. In one embodiment, the two elemental metals in the treated structure are in the form of a solid solution. In one embodiment, the two elemental metals in the treated structure are not in the form of a solid solution. In one embodiment, the atomic ratio of metals in the precursor composition and in the treated deposit is substantially the same. In one embodiment, the atomic ratio of metals in the precursor composition and in the treated deposit are within five percent of each other. In one embodiment, the atomic ratio of metals in the precursor composition and in the treated deposit are within one percent of each other.

In one embodiment, one can further remove at least some of the first metal to leave a nanoporous material comprising at least the second metal. In one embodiment, the removing step is chemical removal by selective etching. In one embodiment, the removing is not an electrochemical removal. In one embodiment, the removing is carried out with acid. In one embodiment, the nanoporous material has an average pore size of about 100 nm or less. In one embodiment, at least a portion of the first metal which is removed is recovered. In one embodiment, the nanoporous material is further subjected to a chemisorption step. In one embodiment, the nanoporous material is further chemically or biochemically modified. In one embodiment, the nanoporous material is further used in a metal Plasmon frequency monitoring process. In one embodiment, the first and second metals are silver, gold, copper, platinum, iridium, nickel, or rhodium, and the precursor composition further comprises at least one solvent. In one embodiment, the first and second metals are silver or gold, and the precursor composition further comprises at least one hydrocarbon solvent.

In one embodiment, the first and second metals are silver or gold, and the precursor composition further comprises at least one hydrocarbon solvent, the depositing step comprises ink jet printing, and the treating step is a heating step at a temperature of less than 250° C., and a removing step is carried out by chemical etching.

Another embodiment provides a composition comprising: at least one first metal complex, wherein the first metal complex comprises a first metal and at least one first ligand and at least one second ligand, different from the first ligand, for the first metal; at least one second metal complex, which is different from the first metal complex, and comprises a second metal and at least one first ligand and at least one second ligand, different from the first ligand, for the second metal; at least one solvent, wherein (i) the selection of the amount of the first metal complex and the amount of the second metal complex, (ii) the selection of the first ligands and the selection of the second ligands for the first and second metals, and (iii) the selection of the solvent are adapted to provide a homogeneous composition.

Another embodiment provides a composition comprising: at least one first metal complex, wherein the first metal complex is a neutral, dissymetrical complex comprising at least one first metal in an oxidation state of (I) or (II), and at least two ligands, wherein at least one first ligand is an amine and at least one second ligand is a carboxylate anion; at least one second metal complex, which is different from the first metal complex, wherein the second metal complex is a neutral, dissymmetrical complex comprising at least one second metal in an oxidation state of (I) or (II), and at least two ligands, wherein at least one first ligand is sulfur compound and at least one second ligand is the carboxylate anion of the first metal complex; at least one organic solvent, and wherein the atomic percent of the first metal is about 20% to about 80% and the atomic percent of the second metal is about 20% to about 80% relative to the total metal content.

Another embodiment provides a method comprising: combining at least one first precursor composition comprising at least one first metal complex and at least one first solvent, and at least one second precursor composition comprising at least one second metal complex different from the first and at least one second solvent, wherein the amounts of the first and second precursor compositions, the first and second solvent, and the ligands of the first and second metal complexes are selected to form a homogeneous and/or completely miscible composition.

At least one additional advantage in at least one embodiment includes formation of porous metal networks that display high conductivity and flexibility.

At least one additional advantage in at least one embodiment includes high optical transparency including increased transparency upon etching.

At least one additional advantage in at least one embodiment includes ability to form homogeneous inks which allow for an intimate alloy to be formed.

At least one additional advantage in at least one embodiment includes ease of controlling film stoichiometry.

At least one additional advantage in at least one embodiment includes ability to tune physical properties of the end product, such as, for example, work function, adhesion, and the like. For example, adhesion to the underlying substrate can be better controlled in at least one embodiment.

At least one advantage in at least one embodiment includes low temperature processing.

At least one additional advantage in at least one embodiment includes not using expensive and cumbersome vacuum conditions and equipment for processing.

At least one additional advantage in at least one embodiment includes ability to tune and control closely the atomic ratio of the metals in the alloy. This can allow, for example, tuning of work function. That can be important for, for example, lowering the overpotential for charge injection into organic semiconductive devices.

At least one additional advantage in at least one embodiment includes lowering of cost by using a less expensive metal as a filler component in an alloy.

At least one additional advantage in at least one embodiment includes providing an excellent, high surface area, porous medium for detection of various analytes. For example, metal Plasmon frequency monitoring can be carried out.

At least one additional advantage in at least one embodiment includes ability to recycle metal which has been removed.

BRIEF DESCRIPTION OF THE FIGURES

FIGS. 5A, 5B, and 5C illustrate one embodiment, showing structural characterization of Ag film (5A), gold film (5B), and electrum metallic alloy films by PXRD (Au:Ag=50:50).

FIGS. 6A and 6B illustrate one embodiment, showing diffraction overlays of Au, Ag and the resulting alloy (Au:Ag=50:50). FIG. 6A shows a broader range than FIG. 6B.

Figure 1:
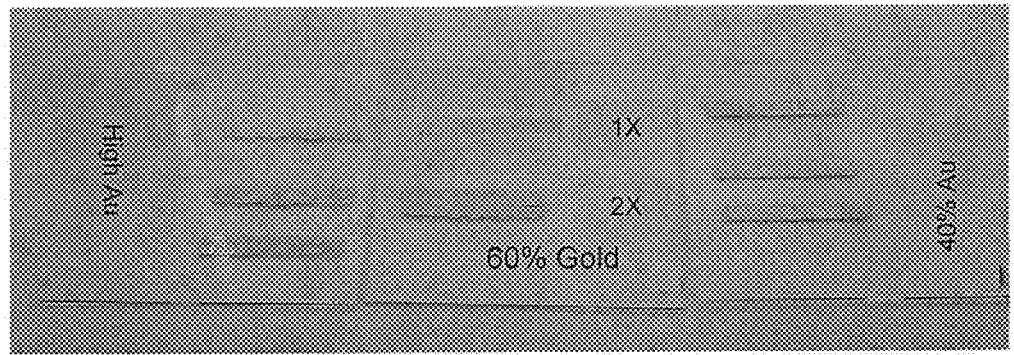
FIG. 1 illustrates embodiments, showing line printing by ink jet printing at different atomic ratios of silver-gold ink after deposition and metallization (including a one time deposition (1×) and a two time deposition (2×).

Figures include, in some cases, color figures and features, and the color features form part of the disclosure.

DETAILED DESCRIPTION

Introduction

Priority provisional U.S. Ser. No. 61/482,571 filed May 4, 2011 is incorporated herein by reference in its entirety.

U.S. Ser. No. 12/941,932 (assignee: Carnegie Mellon University; "Metal Ink Compositions, Conductive Patterns, Methods, and Devices") filed Nov. 8, 2010 and U.S. Ser. No. 61/603,852 ("Self-Reducing Metal Complex Inks Soluble In Polar Protic Solvents") are hereby incorporated by reference for all purposes in their entireties. This includes the description of the precursor compositions, metal complexes, deposition, conversion to metals, the figures, the working examples, and the claims.

In addition, the PhD thesis by Anna Javier submitted to Carnegie Mellon University, dated Apr. 26, 2010 and entitled "Solution-Processable Materials for Printed Electronics," is also incorporated by reference, including Chapter 5 entitled "Solution-Processable Metal-Organic Complexes for Printable Metals."

Microfabrication, printing, ink jet printing, electrodes, and electronics are described in, for example, Madou, *Fundamentals of Microfabrication*, The Science of Miniaturization, 2$^{nd}$ Ed., 2002.

Organic chemistry methods and structures are described in, for example, March's *Advanced Organic Chemistry*, 6$^{th}$ Ed., 2007.

Metals, metal alloys, and metal solid solutions are known in the art. See, for example, Shackelford, *Introduction to Materials Science for Engineers*, 4$^{th}$ Ed., 1996; *Metals Handbook*, 9$^{th}$ Ed., Vol. 2, American Society for Metals, Metals Park, Ohio, 1979. Examples include ferrous alloys, including carbon and low-alloy steels, high-alloy steels, cast irons, and rapidly solidified ferrous alloys. Other examples are nonferrous alloys including aluminum, magnesium, titanium, copper, nickel, zinc, lead, and other alloys.

Inks and alloys are noted in, for example, Ginley U.S. Patent Publication 2010/0163810; Kodas U.S. Pat. No. 6,951, 666; Li U.S. Pat. No. 7,270,694; Kodas U.S. Pat. No. 7,553, 512; and Castillo U.S. Patent Publication No. 2009/0188556.

One embodiment described in further detail below provides a method comprising: depositing at least one precursor composition on at least one substrate to form at least one deposited structure, wherein the precursor composition comprises at least two metal complexes, including at least one first metal complex comprising at least one first metal and at least one second metal complex different from the first metal complex and comprising at least one second metal different from the first metal, treating the deposited structure so that the first metal and the second metal form elemental forms of the first metal and the second metal in a treated structure. Optionally, one can remove at least some of the first metal to leave a nanoporous material comprising at least the second metal.

Precursor Composition

The precursor composition, which can be also called an ink, is adapted to be deposited onto a substrate. The precursor composition can be liquid at ambient temperature. Moreover, after deposition, it can be treated to form elemental metal structures. Here, the metal is, for example, reduced from a (I) or (II) valent state to a zero valent, elemental state, forming the base metal in a mixture with at least one other base metal in an elemental, zero valent state.

The precursor composition can comprise at least one first metal complex, and at least one second metal complex different from the first. It can optionally comprise a third metal complex, or a fourth metal complex, and so forth, with additional metal complexes, wherein each of the metal complexes are different from the other complexes.

In one embodiment, the first and second metal complexes do not react with each other when they are mixed together in the precursor composition.

The precursor composition can further comprise at least one solvent including a linear, branched, or aromatic hydrocarbon solvent such as toluene. In another embodiment, the solvent is a polar protic solvent, such as water, alcohol (including methanol, ethanol, propanol, and the like), glycol, amine or PEG (including ethylene glycol and propylene glycol). In a further embodiment, the solvent system comprises a mixture of solvents. Optionally, the precursor composition can comprise additives including, for example, surfactants, dispersants, binders, and viscosity modifiers.

The metal complexes can be self-reducing.

The precursor composition can be a homogeneous composition.

The precursor composition can be a composition that does not phase separate upon mixing.

One can examine the compositions with an unaided eye under ambient conditions for homogeneity and phase separation. In addition, one can measure homogeneity and phase separation by visual inspection with the unaided eye, as well as with instrumental methods like optical microscopy and/or light scattering.

In addition, the primary focus is to use molecular compounds rather than nanoparticles to achieve the desired results. Hence, the precursor composition can be substantially free or totally free of metallic nanoparticles. In one embodiment, the precursor composition comprises metallic nanoparticles at a level of less than 0.1 wt. %, or less than 0.01 wt. %, or less than 0.001 wt. %. One can examine compositions for particles using methods known in the art including, for example, SEM and TEM, spectroscopy including UV-Vis, plasmon resonance, and the like. Nanoparticles can have diameters of, for example, 1 nm to 500 nm, or 1 nm to 100 nm. The composition comprising the metal complexes can be also free of flakes.

In one embodiment, the precursor composition does not comprise a polymer. In one embodiment, the precursor composition does not comprise a surfactant. In one embodiment, the composition comprises only metal complexes and solvent.

In one embodiment, the precursor composition further comprises at least one solvent. The solvent can be, for example, a hydrocarbon including an aromatic hydrocarbon. The solvent can be, for example, a polar protic solvent, such as water, alcohol, glycol, amine or PEG. Alcohols include methanol, ethanol, propanol, and the like.

In one embodiment, the metal complexes are used without additional solvent.

In one embodiment, the composition is free of, or substantially free of water. For example, the amount of water can be less than 1 wt. %, or the amount of water can be less than 0.1 wt. %, or less than 0.01 wt. %.

In one embodiment, the composition is free of, or substantially free of oxygenated solvent. For example, the amount of oxygenated solvent can be less than 1 wt. %. Or, the amount of oxygenated solvent can be less than 0.1 wt. %, or less than 0.01 wt. %. Oxygenated solvents include, for example, water, methanol, ethanol, alcohols including primary, secondary, and tertiary alcohols, glycols including ethylene glycol, polyethers, aldehydes, and the like.

In one embodiment, the precursor composition has a viscosity adapted for use in ink jet printing for the depositing step. In general, the viscosity can be adapted for the deposition method.

In one embodiment, the viscosity measured at 25° C. can be, for example, about 500 cps or less, or about 250 cps or less, or about 100 cps or less. In another embodiment, it can be about 1,000 cps or more. In one embodiment, the precursor composition has a viscosity of about 1 cps to about 20 cps, or about 1 cps to about 10 cps.

Metal Complexes

The metal complex, including first and second metal complexes, can be a precursor to a homogeneous mixture of two or more complexes that is a precursor to a metal alloy film. Metal organic and transition metal compounds, metal complexes, metals, and ligands are described in, for example, Lukehart, *Fundamental Transition Metal Organometallic Chemistry*, Brooks/Cole, 1985; Cotton and Wilkinson, *Advanced Inorganic Chemistry: A Comprehensive Text*, $4^{th}$ Ed., John Wiley, 2000.

In one embodiment of the metal complexes of this invention are described in U.S. Ser. No. 12/941,932 and U.S. Ser. No. 61/603,852, including the working examples. The metal complex can be homoleptic or heteroleptic. The metal complex can be mononuclear, dinuclear, trinuclear, and higher. The metal complex can be a covalent complex. The metal complex can be free from metal-carbon formal bonding. The metal complexes can be readily soluble at 25° C.

The first metal complex can comprise at least one first metal, and the second metal complex can comprise at least one second metal, and the third metal complex can comprise at least on third metal, and so forth.

The metal complexes can be soluble, including soluble in, for example, a non-polar or less polar solvent such as a hydrocarbon, including an aromatic hydrocarbon. Aromatic hydrocarbon solvents to test solubility include, for example, benzene and toluene, as well as xylene and mixtures of xylenes. Polyalkylaromatics can be used. Further, the metal complexes can be soluble in, for example, a polar protic solvent such as water, alcohol, glycol, amine or PEG.

The metal complexes can be dissymmetric which can facilitate solubility and good homogeneity for mixtures of metal complexes. Dissymmetric molecules are known in the art. See, for example, Cotton, *Chemical Applications of Group Theory*, $3^{rd}$ Ed., and U.S. Pat. Nos. 7,001,526, 5,585,457, 4,619,970, and 4,410,538. dissymmetric molecules can have a C1 symmetry with only the identity operator E.

Metals and transition metals are known in the art. Examples include Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, Au, and Hg. In particular, coinage metals can be used including silver, gold, and copper. Precious metals can be used including gold, iridium, osmium, palladium, platinum, rhodium, ruthenium, and silver. In other preferred embodiments, platinum, nickel, cobalt, and palladium can be used. Still further, lead, iron, tin, ruthenium, rhodium, iridium, zinc, and aluminum can be used. Other metals and elements can be used as known in the art.

In one embodiment, the first metal complex is a silver, gold, copper, platinum, nickel, iridium, or rhodium complex. In one embodiment, the first metal complex is a silver complex.

In one embodiment, the second metal complex is a silver, gold, copper, platinum, nickel, iridium, or rhodium complex. In one embodiment, the second metal complex is a gold complex.

In one embodiment, the precursor composition further comprises at least one third metal complex different from the first and second metal complexes and comprising at least one third metal different from the first and second metals. The third metal can be, for example, copper, platinum, and iridium. In one embodiment, in particular, the third metal is copper.

In one embodiment, for the precursor composition the atomic percent of the first metal is about 1% to about 99% and the atomic percent of the second metal is about 1% to about 99% relative to the total metal content. In one embodiment, for the precursor composition the atomic percent of the first metal is about 10% to about 90% and the atomic percent of the second metal is about 10% to about 90% relative to the total metal content. In another embodiment, for the precursor composition, the atomic percent of the first metal is about 20% to about 80% and the atomic percent of the second metal is about 20% to about 80% relative to the total metal content.

The total amount of metal complex, including for example the total amount of the first metal complex and the second metal complex, relative to the total amount of precursor composition is about 500 mg/mL or less, or about 250 mg/mL or less, or about 200 mg/mL or less, or about 150 mg/mL or less, or about 100 mg/mL or less. The lower amount can be, for example about 1 mg/mL or more, or about 10 mg/mL or more. Ranges can be formulated with these upper and lower embodiments, including for example, about 1 mg/mL to about 500 mg/mL. One particular range is about 60 mg/mL to about 200 mg/mL.

In one embodiment, the first metal complex and the second metal complex each comprise only one metal center.

In one embodiment, the first metal of the first metal complex and the second metal of the second metal complex each are in an oxidation state of (I) or (II).

The metal complex can comprise a plurality of ligands including two or more ligands, or just two ligands. There can be, for example, a first ligand and a second ligand, different from each other. The first ligand can provide sigma electron donation, or dative bonding. The first ligand can be in a neutral state, not an anion or cation. Examples of the first ligand include amines, oxygen-containing ligands, and sulfur-containing ligands including oxygenated ethers and thioethers, including cyclic thioethers. Asymmetrical or symmetrical amines can be used. The amines can comprise, for example, at least two primary or secondary amine groups. Monodentate ligands can be used. Polydentate or multidentate ligands can be used. Alkylamino ligands can be used.

The second ligand can be different from the first ligand and can volatilize upon heating the metal complex. For example, it can release carbon dioxide, as well as volatile small organic molecules such as propene, in some embodiments. The second ligand can be a chelator with minimum number of atoms that can bear an anionic charge and provide a neutral complex. The second ligand can be anionic. For example, the second ligand can be a carboxylate, including a carboxylate comprising a small alkyl group. The number of carbon atoms in the alkyl group can be, for example, ten or less, or eight or less, or five or less. The molecular weight of the second ligand can be, for example, about 1,000 g/mol or less, or about 250 g/mol or less, or about 150 g/mole or less.

The first and second ligand, as well as any other ligands, can be selected to provide dissymmetrical complexes.

In one embodiment, the first metal complex comprises at least one carboxylate ligand. In one embodiment, the first metal complex comprises at least one amino ligand. In one embodiment, the first metal complex comprises at least one carboxylate ligand and at least one amino ligand.

In one embodiment, the second metal complex comprises at least one carboxylate ligand. In one embodiment, the second metal complex comprises at least one neutral, sulfur-containing ligand. In one embodiment, the second metal complex comprises at least one carboxylate ligand and at least one neutral, sulfur-containing ligand.

Specific examples of metal complexes include:

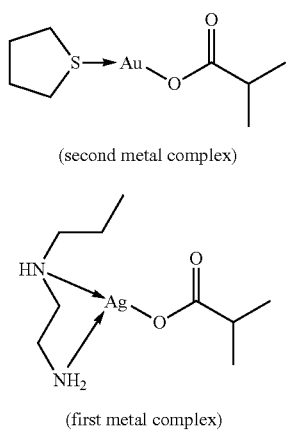

(second metal complex)

(first metal complex)

As described more below, the complexes can be treated to form elemental metal alloys. If desired, one or more of the metals in the alloy can be removed.

Examples of binary combinations of metals to form binary alloys include Ag—Au, Pt—Rh, Au—Cu, Zn—Cu, Pt—Cu, Ni—Al, Cu—Al, Pt—Ni, and Pt—Ir.

One of the metals can be removed if desired, and the selection of the first metal and the second metal can be adapted so that one (the first metal) can be removed. For example, aluminum can be removed as a first metal from a nickel-aluminum alloy to yield porous nickel, or from a copper-aluminum alloy to yield porous copper. If a third metal or additional metal is present, it can be adapted to be removed or to remain upon removal of metal.

Examples of ternary metal combinations and alloys include, for example, Fe—Ni—Cr, Co—Cr—Fe, Co—Cr—Ni, Co—Cr—W, Co—Fe—Mo, Co—Fe—Ni, Co—Fe—W, and Co—Mo—Ni.

Quaternary metal combinations and alloys are known in the art and can be prepared.

Combinatorial arrays of alloys can be prepared. The concentrations of the metal in the alloy can be varied, and it can be controlled by the concentration of the metal (or metal complex) in the precursor composition. Gradient embodiments can be practiced where, for example, multilayer structures can be prepared with varying, gradient concentrations of metal from layer to layer. Upon heating, the metals will begin to diffuse giving rise to a functionally graded alloy of metals varied from their interfaces.

Selections for Homogeneous Precursor Compositions

One embodiment provides a composition comprising: at least one first metal complex, wherein the first metal complex comprises a first metal and at least one first ligand and at least one second ligand, different from the first ligand, for the first metal; at least one second metal complex, which is different from the first metal complex, and comprises a second metal and at least one first ligand and at least one second ligand, different from the first ligand, for the second metal; at least one solvent, wherein (i) the selection of the amount of the first metal complex and the amount of the second metal complex, (ii) the selection of the first ligands and the selection of the second ligands for the first and second metals, and (iii) the selection of the solvent are adapted to provide a homogeneous composition.

In one embodiment, for example, the first metal complex is a silver, gold, copper, platinum, iridium, nickel, or rhodium complex. In particular, the first metal complex can be a silver complex.

In one embodiment, the second metal complex is a silver, gold, copper, platinum, iridium, nickel, or rhodium complex. In a particular embodiment, the second metal complex is a gold complex.

In additional embodiments, the first metal complex is a silver complex and the second metal complex is a gold complex, or the first metal complex is a platinum complex and the second metal complex is a gold complex, or the first metal complex is a platinum complex and the second metal complex is an iridium complex, or the first metal complex is a platinum complex and the second metal complex is a rhodium complex. For example, in one embodiment, the first metal complex is a silver complex and the second metal complex is a gold complex.

In one embodiment, the first ligand of the first metal complex is a carboxylate. In another embodiment, the first ligand of the second metal complex is a carboxylate. In one embodiment, the two first ligands of the two complexes are the same.

In one embodiment, the first metal complex and the second metal complex are each dissymmetric complexes.

In one embodiment, the atomic percent of the first metal is about 10% to about 90% and the atomic percent of the second metal is about 10% to about 90% relative to the total metal content. In another embodiment, the atomic percent of the first metal is about 20% to about 80% and the atomic percent of the second metal is about 20% to about 80% relative to the total metal content.

In one embodiment, the solvent is a hydrocarbon, or an aromatic hydrocarbon, or a substituted aromatic hydrocarbon. In another embodiment, the solvent is a polar protic solvent such as water, alcohol, glycol, amine or PEG.

In one embodiment, the first and second metal complexes comprise at least 25 wt. % metal, or at least 50 wt. % metal, or at least 70 wt. % metal.

In one embodiment, the amount of the first complex and the second complex relative to the total amount of composition is about 500 mg/mL or less, or about 250 mg/mL or less.

In one embodiment, the composition has a viscosity adapted for use in ink jet printing. For example, the precursor composition can have a viscosity of about 1 cps to about 20 cps.

In one embodiment, the first metal complex and the second metal complex each comprise only one metal center.

In another embodiment, the first metal of the first metal complex and the second metal of the second metal complex each are in an oxidation state of (I) or (II).

In one embodiment, the first metal complex comprises at least one alkylcarboxylate ligand. In one embodiment, the first metal complex comprises at least one amino ligand. In one embodiment, the first metal complex comprises at least one carboxylate ligand and at least one amino ligand.

In another embodiment, the second metal complex comprises at least one alkylcarboxylate ligand. In addition, the second metal complex can comprise at least one sulfur-containing ligand. In addition, the second metal complex can comprise at least one carboxylate ligand and at least one sulfur-containing ligand.

In one embodiment, the first metal complex is a silver complex, and the second metal complex is a gold complex.

In one embodiment, the precursor composition is totally free of metallic nanoparticles.

In one embodiment, the first metal complex comprises at least one carboxylate ligand and at least one amine ligand, and the second metal complex comprises at least one carboxylate ligand and at least one thioether ligand. The amine ligand can be polydentate.

In one embodiment, the first metal complex and the second metal complex each comprise a carboxylate ligand which is the same for each complex.

In one embodiment, the first metal complex and the second metal complex each comprise a carboxylate ligand which has eight or fewer carbon atoms.

In one embodiment, the solvent is a hydrocarbon, and wherein the amount of the first complex and the second complex relative to the total amount of composition is about 500 mg/mL or less.

In one embodiment, the first metal complex is a silver complex, and the second metal complex is a gold complex, and wherein the amount of the first complex and the second complex relative to the total amount of composition is about 500 mg/mL or less.

In one embodiment, the first metal complex is a silver complex, and the second metal complex is a gold complex, and wherein the amount of the first complex and the second complex relative to the total amount of composition is about 500 mg/mL or less, and wherein the composition has a viscosity adapted for use in ink jet printing.

In one embodiment, the first metal complex is a silver complex, and the second metal complex is a gold complex, wherein the precursor composition is substantially free of metallic nanoparticles, and wherein the first metal of the first metal complex and the second metal of the second metal complex each are in an oxidation state of (I) or (II).

In one embodiment, the atomic percent of the first metal is about 20% to about 80% and the atomic percent of the second metal is about 20% to about 80% relative to the total metal content, wherein the solvent is a hydrocarbon, and wherein the first and second metal complexes comprise at least 50 wt. % metal.

Another Embodiment for Precursor Composition

In another embodiment, a precursor composition is provided comprising: at least one first metal complex, wherein the first metal complex is a neutral complex comprising at least one first metal in an oxidation state of (I) or (II), and at least two ligands, wherein at least one first ligand is an amine and at least one second ligand is a carboxylate anion; at least one second metal complex, which is different from the first metal complex, wherein the second metal complex is a neutral complex comprising at least one second metal in an oxidation state of (I) or (II), and at least two ligands, wherein at least one first ligand is sulfur compound and at least one second ligand is the carboxylate anion of the first metal complex; and at least one organic solvent, and wherein the atomic percent of the first metal is about 20% to about 80% and the atomic percent of the second metal is about 20% to about 80% relative to the total metal content.

Methods of Making Metal Complexes and Precursor Compositions

The metal complexes can be made by a variety of methods, many of which are described in U.S. Ser. No. 12/941,932 and U.S. Ser. No. 61/603,852 and incorporated herein by reference. Precursor compositions can be made by combining the metal complex containing the first metal with the metal complex containing the second metal to obtain a mixture. In one example, the solubility or homogeneity the metal complex composition may be tuned by alternating and/or decorating the periphery of the organic ligands associated with one or more of the metal complexes.

In one embodiment, the mixture does not show separation upon visual observation. In one embodiment, the mixture is a homogeneous solution. In one embodiment the mixture contains a solvent.

One embodiment provides a method comprising: combining at least one first precursor composition comprising at least one first metal complex and at least one first solvent, and at least one second precursor composition comprising at least one second metal complex different from the first and at least one second solvent, wherein the amounts of the first and second precursor compositions, the first and second solvent, and the ligands of the first and second metal complexes are selected to form a homogeneous composition.

Depositing

Methods known in the art can be used to deposit inks including direct and indirect methods. See, for example, *Direct-Write Technologies for Rapid Prototyping Applications* (Ed. A. Pique and D. Chrisey), 2002. Methods for depositing include, for example, spin coating, pipetting, ink-jet printing, blade coating, rod coating, dip coating, lithography or offset printing, gravure, flexography, screen printing, stencil printing, drop casting, slot die, roll-to-roll, spraying, microcontact printing, and stamping. One can adapt the ink formulation and the substrate with the deposition method. See also *Direct Write Technologies* book cited above, wherein for example, chapter 7 describes inkjet printing. Contact and non-contact deposition can be used. In one embodiment, evaporation or vacuum deposition is not used. In one embodiment, sputtering is not used. The line-of-sight issues, high vacuum and high expenses associated with sputtering can be avoided. Liquid deposition can be used.

In one embodiment, the depositing step comprises drop casting, spin coating, ink jet printing, roll-to-roll, slot-die, gravure, and microcontact printing. For spin coating, the rpm can be, for example, 500 rpm to 10,000 rpm, or 700 rpm to 5,000 rpm.

In one embodiment, the depositing step comprises ink jet printing. In one embodiment, the depositing step is not carried out under a vacuum. In one embodiment, the depositing step does not comprise sputtering. In one embodiment, the depositing step does not comprise electrochemical deposition.

In one embodiment, the depositing step is carried out at least twice on the same position on the substrate. The same precursor composition can be used in the multiple layers, or different precursor compositions can be used from layer-to-layer.

One can adapt the viscosity of the ink to the deposition method. For example, viscosity can be adapted for ink jet printing. Viscosity can be, for example, about 500 Cps or less. Or viscosity can be, for example, 1,000 Cps or more.

One can also adapt the concentration of dissolved solids in the ink. The concentration of the dissolved solids in the ink can be, for example, about 500 mg/mL or less, or about 250 mg/mL or less, or about 100 mg/mL or less, or about 150 mg/mL or less, or about 100 mg/mL or less. A lower amount can be, for example, about 1 mg/mL or more, or about 10 mg/mL or more. Ranges can be formulated with these upper and lower embodiments including, for example, about 1 mg/mL to about 500 mg/mL. In addition, the wetting properties of the ink can be adapted.

Additives such as, for example, surfactants, dispersants, and/or binders can be used to control one or more ink properties if desired for use in a particular depositing method. In one embodiment, an additive is not used. In one embodiment, a surfactant is not used.

Nozzles can be used to deposit the precursor, and nozzle diameter can be, for example, less than 100 microns, or less than 50 microns. The absence of particulates can help with prevention of nozzle clogging.

In deposition, solvent can be removed, and the initial steps for converting metal precursor to metal can be started.

Multiple deposition steps can be carried out, and multilayers can be formed.

In one embodiment, the deposited structure can be a film or a line, for example, whether linear or curvilinear. In another embodiment, the deposited structure is a dot, spot, circle, or vertex-shared polygon or polygon-like structures.

Substrate

A wide variety of solid materials can be subjected to deposition of the metal inks. Polymers, plastics, metals, ceramics, glasses, silicon, semiconductors, insulators, and other solids can be used. Organic and inorganic substrates can be used. High temperature polymers can be used. Polyester or polyimide types of substrates can be used. Paper substrates can be used. Printed circuit boards can be used. Substrates used in applications described herein can be used.

Other examples of substrates include three dimensional substrates, fabrics, gauze, porous substrates, and antimicrobial substrates including porous antimicrobial substrates.

Substrates can comprise electrodes and other structures including conductive or semiconductive structures.

In one embodiment, the substrate is a flexible or a rigid substrate. In one embodiment, the substrate is a polymeric substrate. In one embodiment, the substrate is a glass or a semiconductor material.

Treating or Converting Step

The inks and compositions comprising metal complexes can be deposited and treated, reacted, or otherwise converted to metallic structures including films and lines. Heat and/or light can be used including laser light. A variety of radiations can be used including a full spectrum of wavelengths. Electron beam, x-ray, and/or deep UV methods can be used. The atmosphere around the metal film can be controlled. For example, oxygen can be included or excluded. Volatile by-products can be eliminated.

The heating temperature can be lower than the melting temperature of the metals.

The heating temperature can be determined with use of measurement of the thermal decomposition profiles.

In one embodiment, the treating step is a heating step or an exposure to radiation step.

In one embodiment, the treating step is a heating step at less than 300° C. In one embodiment, the treating step is a heating step at less than 250° C. In one embodiment, the treating step is a heating step at less than 200° C. In one embodiment, the treating step is a heating step at less than 150° C.

In one embodiment, the two elemental metals in the treated structure are in the form of an alloy.

In one embodiment, the two elemental metals in the treated structure are in the form of a solid solution. In one embodiment, the two elemental metals in the treated structure are not in the form of a solid solution.

In one embodiment, the atomic ratio of metals in the precursor composition and in the treated deposit is substantially the same. In another embodiment, the atomic ratio of metals in the precursor composition and in the treated deposit are within ten percent of each other. In another embodiment, the atomic ratio of metals in the precursor composition and in the treated deposit are within five percent of each other. In another embodiment, the atomic ratio of metals in the precursor composition and in the treated deposit are within one percent of each other.

Treated Structure: Metallic Lines After Deposition and Treatment

The metallic structures, including lines and films, can be coherent and continuous. Continuous metallization can be observed with good connectivity between grains and low surface roughness.

The metals can form an alloy. The metals can form a solid solution. In one embodiment, electrum-like alloys can be prepared.

Line width can be, for example, 1 micron to 500 microns, or 5 microns to 300 microns. Line width can be less than one micron if nanoscale patterning methods are used.

Line thickness can be, for example, about one micron or less, or about 500 nm or less, or about 300 nm or less, or about 100 nm or less.

Dots or circles can be also made. Curvilinear structures can be made. In addition, vertex-shared polygon or polygon-like structures, such as vertex-shared polyhedrons, can be made.

In one embodiment, ink formulations can be converted to metallic lines and films without formation of substantial amounts of metal particles, microparticles, or nanoparticles.

Metal lines and films can be prepared with characteristics of metal and lines prepared by other methods like sputtering.

Metal lines and films can be, for example, at least 90 wt. % metal, or at least 95 wt. % metal, or at least 98 wt. % metal.

Metal lines and films can be relative smooth (<10 nm) according to AFM measurements.

Metal lines and films can be used to join structures such as electrodes or other conductive structures.

The metal can have a work function which is substantially the same as a native metal work function, or in the case of alloys, work functions that reflect the mixture of metals. For example, the difference can be 25% or less, or 10% or less.

Lines and grids can be formed. Multi-layer and multi-component metal features can be prepared.

Some alloys such as a gold-silver alloy can provide excellent transport properties with superior alloy adhesion to a substrate compared to that of either pure metal alone.

In one embodiment, the metallic structure is different in size compared to the metal leaf as described in WO 2004/020064 (Erlebacher).

Dealloying, Removal of Metal

The metal complexes and methods of using them can be selected so that one metal can be separated from the other metal. Dealloying can be carried out by methods such as chemical etching or electrochemical methods. Dealloying, for example, is described in WO 2004/020064 (Erlebacher). See also U.S. Pat. No. 4,977,038 (Sieradzki).

The dealloying can be carried out when the metallic structure is disposed on the substrate.

In one embodiment, the removal step is not optional but carried out.

In one embodiment, the removing step is a chemical removal. In one embodiment, the removing is not an electrochemical removal.

The metallic lines can be, for example, selectively etched to remove some or all of the first metal from the reacted deposit to yield a porous metallic material. Methods for removal of some or all of one elemental metal from a mixture of two or more elemental metals is known in the art. For etching, the temperature of etching can be, for example, about 20° C. to about 50° C. Methods like sonication can be carried out to enhance removal.

Etching can be carried out with use of acid, including inorganic or organic acid. Mineral acids can be used including, for example, nitric acid, sulfuric acid, or hydrochloric acid. Perchloric acid can be used. A single acid or a mixture of acids including, for example, aqua regia, can be used. For etching, if carried out with acid, the concentration of the acid can be, for example, 3 M or less, or 1 M or less.

In another embodiment, thionyl chloride can be used.

In one embodiment, the first metal is selectively removed by contact with acidic aqueous solution.

The etching/dealloying can cause a change in impedance of the resulting nanoporous material. As a result, the nanoporous material may have a unique electrical property for various biological applications, including, for example, stimulating muscle response in vivo.

In one embodiment, the etching/dealloying results in a gold nanoporous material suitable for making glucose sensors.

Nanoporous Material

In one embodiment, the nanoporous material has an average pore size of about 100 nm or less, or about 50 nm or less, or about 25 nm or less. Porosity and other properties can be measured by methods known in the art including, for example, SEM and BET. In addition, the nanoporous materials can be characterized by nanoindentation methods.

Other Processing Steps

In one embodiment, at least a portion of the first metal such as silver which is removed is recovered. For example, at least 50 wt. %, or at least 75 wt. %, or at least 90 wt. %, of the material can be recovered.

In one embodiment, the nanoporous material is further subjected to a chemisorption step. For example, a compound or material can be chemisorbed to the metal. For example, a sulfur compound such as a thiol or disulfide can be chemisorbed to a second metal such as gold. For example, one or more biomolecules including receptors, ligands, antibodies, antigens, polypeptides or polynucleotides can be chemisorbed to the nanoporous material, directly or indirectly. Intermediate layers can be used between the metal and the biomolecule of interest. The resulting nanoporous material can be used for various biological applications including, for example, cell culture, drug delivery, and detecting one or more analytes from a sample via, for example, antigen-antibody interaction, receptor-ligand interaction, or DNA-DNA interaction.

In one embodiment, the nanoporous material is further chemically modified. For example, the material can be modified with a lumiphore for the detection of analytes through absorption changes in the optical properties upon binding.

In one embodiment, the nanoporous material is further used in a metal plasmon frequency monitoring process.

Metastable Alloy Embodiment

Metastable alloys can be prepared. Non-thermodynamic pathways to new morphology can be prepared. In other words, metastable phases can be formed. An example is a quasicrystal with five-fold symmetry for hydrogen storage.

Applications

Additional applications can be found for both the treated structures as well as treated structures subjected to a removal or de-alloying step.

One application for embodiments described herein includes optics fabrication. Examples of such applications include transparent conductors or waveguides.

One application for embodiments described herein includes electronics fabrication. Examples of such applications include organic electronic devices, including organic photovoltaic devices and electroluminescent devices, electrodes, and interconnects.

One application for embodiments described herein includes heterogeneous catalysis. Examples of such applications include hydrogenation and oxidation.

Another application for embodiments described herein includes bioanalyte detection. Examples of such applications include SERS.

Another application for embodiments described herein includes as a structural material.

Another application for embodiments described herein includes materials with desirable transport properties. Examples include electrodes.

Another application for embodiments described herein includes as ITO replacement. The material can be conductive and transparent.

Another application for embodiments described herein includes in fuel cells including gas diffusion membranes.

Another application for embodiments described herein includes as magnetic material. In one examples, the magnetic material is a metallic alloy comprising nickel.

In another application for embodiments described herein, the porous material can be used as a framework for other materials.

In another application for embodiments described herein, the porous metal material, attached with biomolecules, can be used for detecting one or more analytes from a sample.

In another application for embodiments described herein, the porous metal material, due to its unique electrical property, can be used for stimulating muscle responses in vivo.

In another application for embodiments described herein, the porous gold material can be used as a sensor including, for example, glucose sensors.

Devices can be prepared comprising the materials prepared by methods described herein.

ADDITIONAL SELECTED PREFERRED EMBODIMENTS

In one embodiment, the first and second metals are silver, gold, copper, or platinum, and the precursor composition further comprises at least one solvent.

In one embodiment, the first and second metals are silver or gold, and the precursor composition further comprises at least one hydrocarbon solvent.

In one embodiment, the first and second metals are silver or gold, and the precursor composition further comprises at least one solvent, the depositing step comprises ink jet printing, and the treating step is a heating step at a temperature of less than 250° C., and the optional removing step is carried out by chemical etching.

Working Examples

Instrumentation and Methods: SEM/EDX analysis was performed on a Philips XL-30 SEM. Powder X-ray diffraction analysis was performed using a Rigaku PXRD machine. Inkjet printing was carried out on a Dimatix printer. NMR was used to confirm structures in some examples. Spin coating was carried out with use of a SCS G3P-8 spin coater. Drop casting was carried out with use of a pipette on glass or silicon.

Sources of materials included Aldrich, Amresco, Fisher, STREM, and VWR.

Purification of Materials: Materials were filtered and volatiles removed under vacuum in some examples. Solvents were distilled over calcium hydride in some examples.

Example 1

Silver Component: (N-Propylethylenediamine Silver Isobutyrate)

0.67 g (3.4 mmol) of silver isobutyrate (prepared as described in U.S. Ser. No. 12/941,932) was massed and set to stir under $N_2$. To this was added 4.2 ml (34 mmol) of N-propylethylenediamine via a glass syringe. After 10 minutes under nitrogen at room temperature, all solids dissolved to afford a clear, homogeneous solution. After 2 h, the excess N-propylethylenediamine was removed in vacuo leaving behind a yellow, deliquescent waxy solid. A 100 mg/mL toluene solution was made and filtered through a 0.45 μm syringe filter yielding the ink product.

Example 2

Gold Component (Tetrahydrothiophene Gold Isobutyrate)

1.88 g (5.87 mmol) of tetrahydrothiophene gold chloride (prepared as described in U.S. Ser. No. 12/941,932) was added to 1.37 g (7.03 mmol) silver isobutyrate (prepared as above) and stirred in 30 mL toluene forming a white suspension. This mixture was stirred overnight under ambient conditions (air at room temperature) yielding a heterogeneous yellow solution with gray solids. The solids were removed by 0.45 μm syringe filter and the volatiles removed in vacuo yielding a viscous brown oil. The ink was made by diluting this oil to a 100 mg/mL toluene solution which was again syringe filtered.

The reaction is illustrated below:

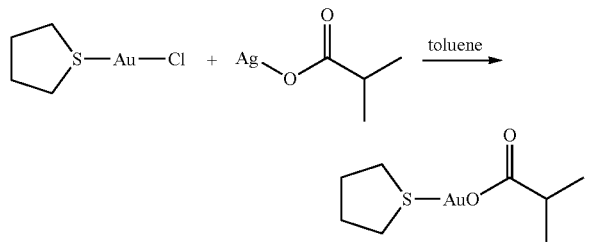

Example 3

Precursor Composition

After filtration, silver and gold inks were mixed at room temperature in a volume ratio equivalent to the desired final film metal stoichiometry. The resulting composition was a homogeneous mixture as determined by visualization with the unaided eye. Spin coating was carried out with EDX of spun films.

Example 4

Metal Alloy Films

Films made from a 50:50 gold:silver ink (atomic ratio) were spun cast on phosphorus doped silicon which had been washed with hexane/acetone/IPA and ozone treated. Films were spun at 800, 1500, and 5,000 rpm and heated to 250° C. for 20 min.

Example 5

Etching

A 800 rpm and a 5,000 rpm film, as prepared in example 4, were each submerged in 3M $HNO_3$ overnight and sonicated for 10 min. Films showed increased optical transparency post etch and were susceptible to delamination.

Example 6

Analysis of Films Before Etching

FIG. 1 illustrates one embodiment, showing varying gold: silver ratios after ink metallization.

Figure 2:
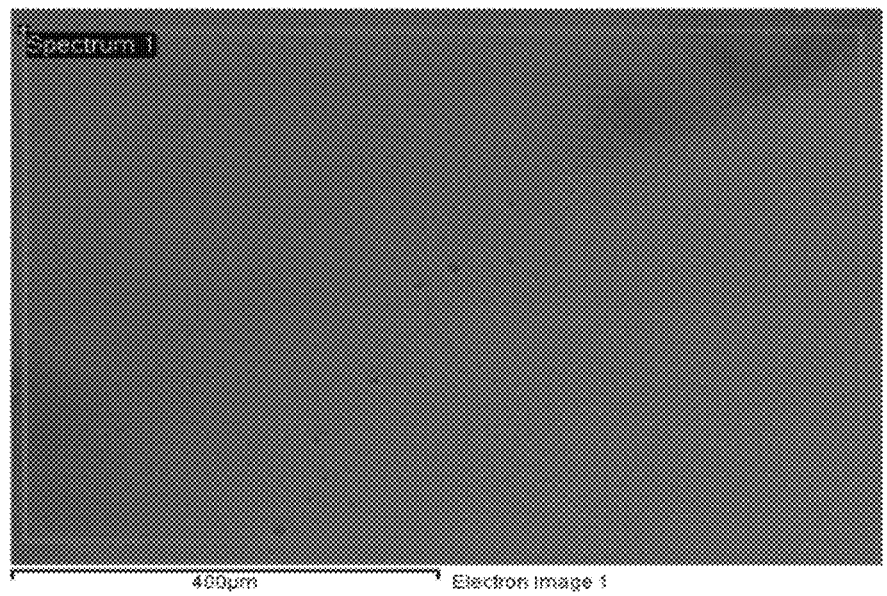
FIG. 2 illustrates one embodiment, showing SEM/EDX of the resulting alloy from an ink containing a 60% Ag and 40% Au atomic ratio (lower magnification).
Figure 2:
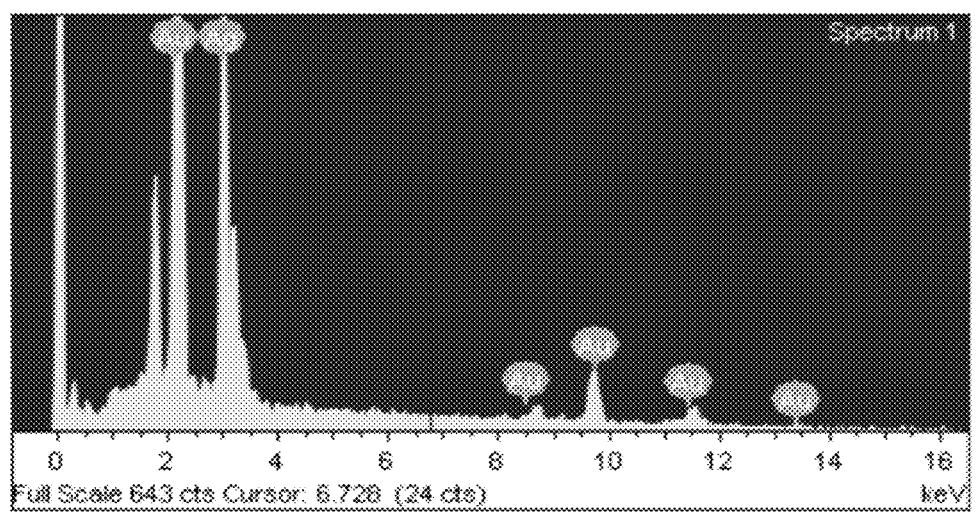

FIG. 2 illustrates one embodiment, showing SEX/EDX of 60% Ag and 40% Au (atomic ratio) inkjet printed alloy line (lower magnification). Spectrum processing: No peaks omitted. Processing option: All elements analyzed (Normalised). Number of iterations=2.

| Element | Weight % | Atomic % |
|---|---|---|
| Ag L | 46.31 | 61.17 |
| Au M | 53.69 | 38.83 |
| Totals | 100.00 | |

Figure 3:
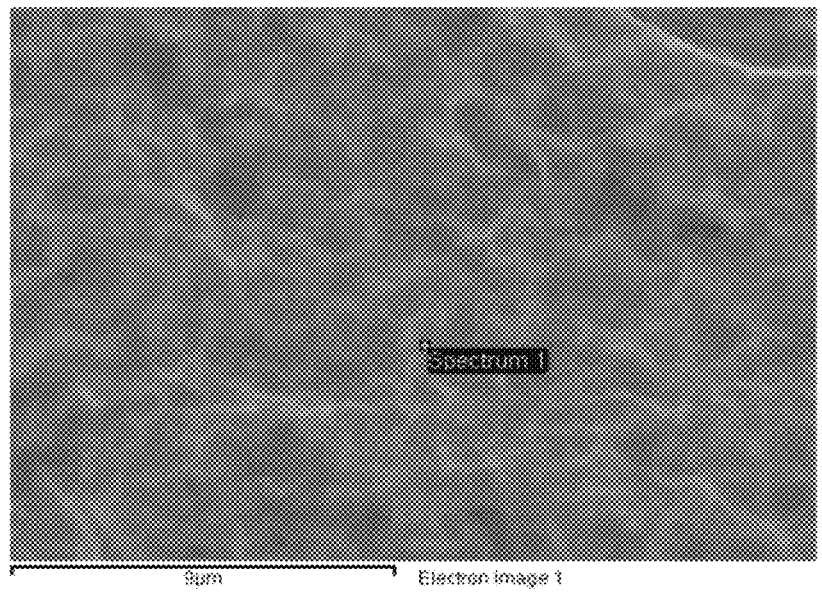
FIG. 3 illustrates one embodiment, showing SEM/EDX of the resulting alloy from an ink containing a 60% Ag and 40% Au atomic ratio (higher magnification compared to FIG. 2).
Figure 3:
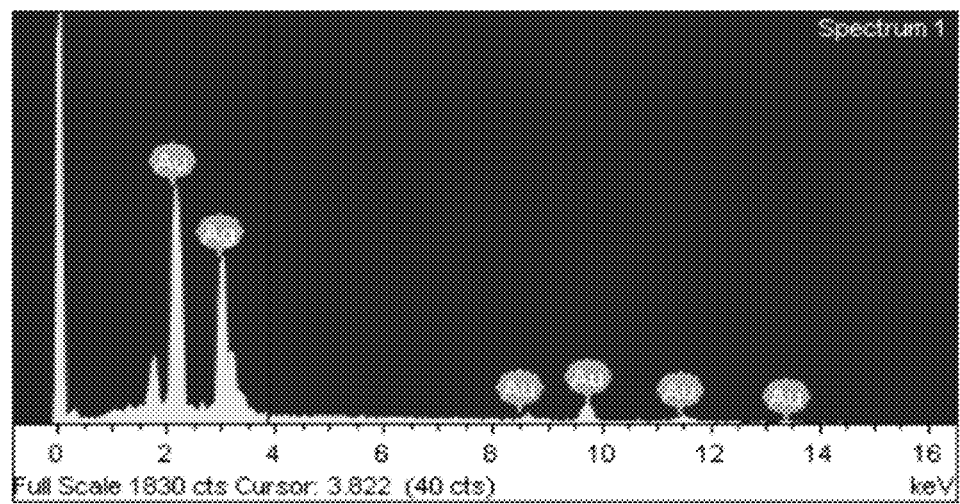

FIG. 3 illustrates one embodiment, showing SEM/EDX of 60% Ag and 40% Au (atomic ratio) inkjet printed alloy line (higher magnification compared to FIG. 2). Spectrum processing: No peaks omitted. Processing option: All elements analyzed (Normalised). Number of iterations=2.

| Element | Weight % | Atomic % |
|---|---|---|
| Ag L | 45.40 | 60.29 |
| Au M | 54.60 | 39.71 |
| Totals | 100.00 | |

Figure 4:
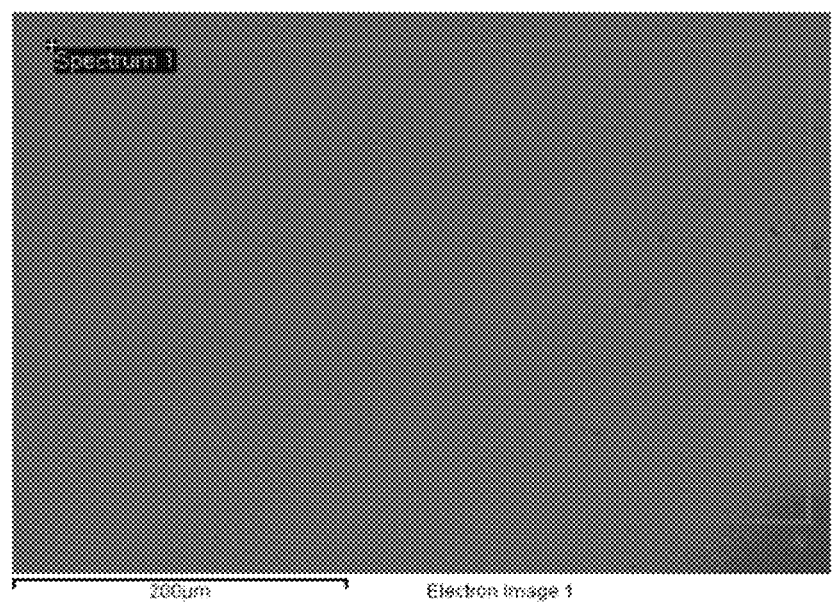
FIG. 4 illustrates one embodiment, showing SEM/EDX of the resulting alloy from an ink containing a 20% Ag and 80% Au atomic ratio.
Figure 4:
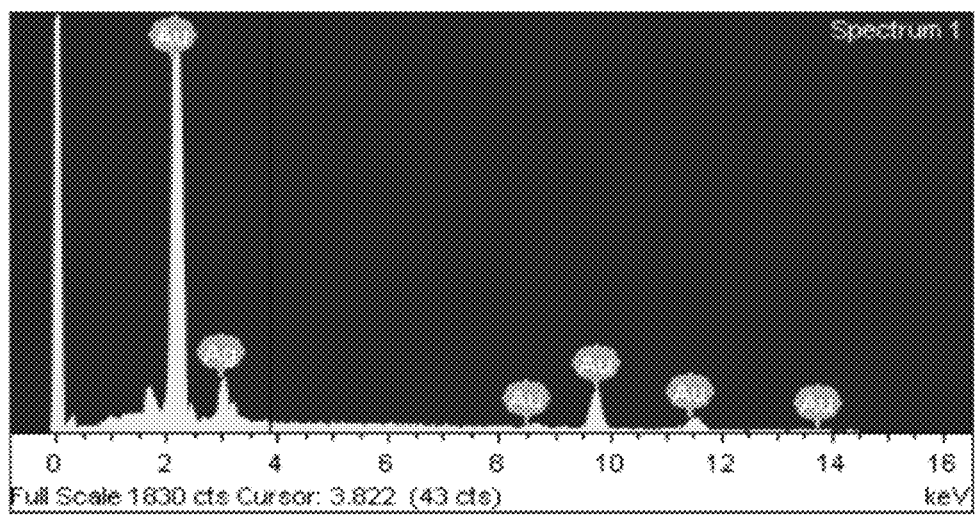

FIG. 4 illustrates one embodiment, showing SEM/EDX of 20% Ag and 80% Au (atomic ratio) inkjet printed alloy line. Spectrum processing: No peaks omitted. Processing option: All elements analyzed (Normalised). Number of iterations=2.

| Element | Weight % | Atomic % |
|---|---|---|
| Ag L | 12.37 | 20.50 |
| Au M | 87.63 | 79.51 |
| Totals | 100.00 | |

Figure 5A:
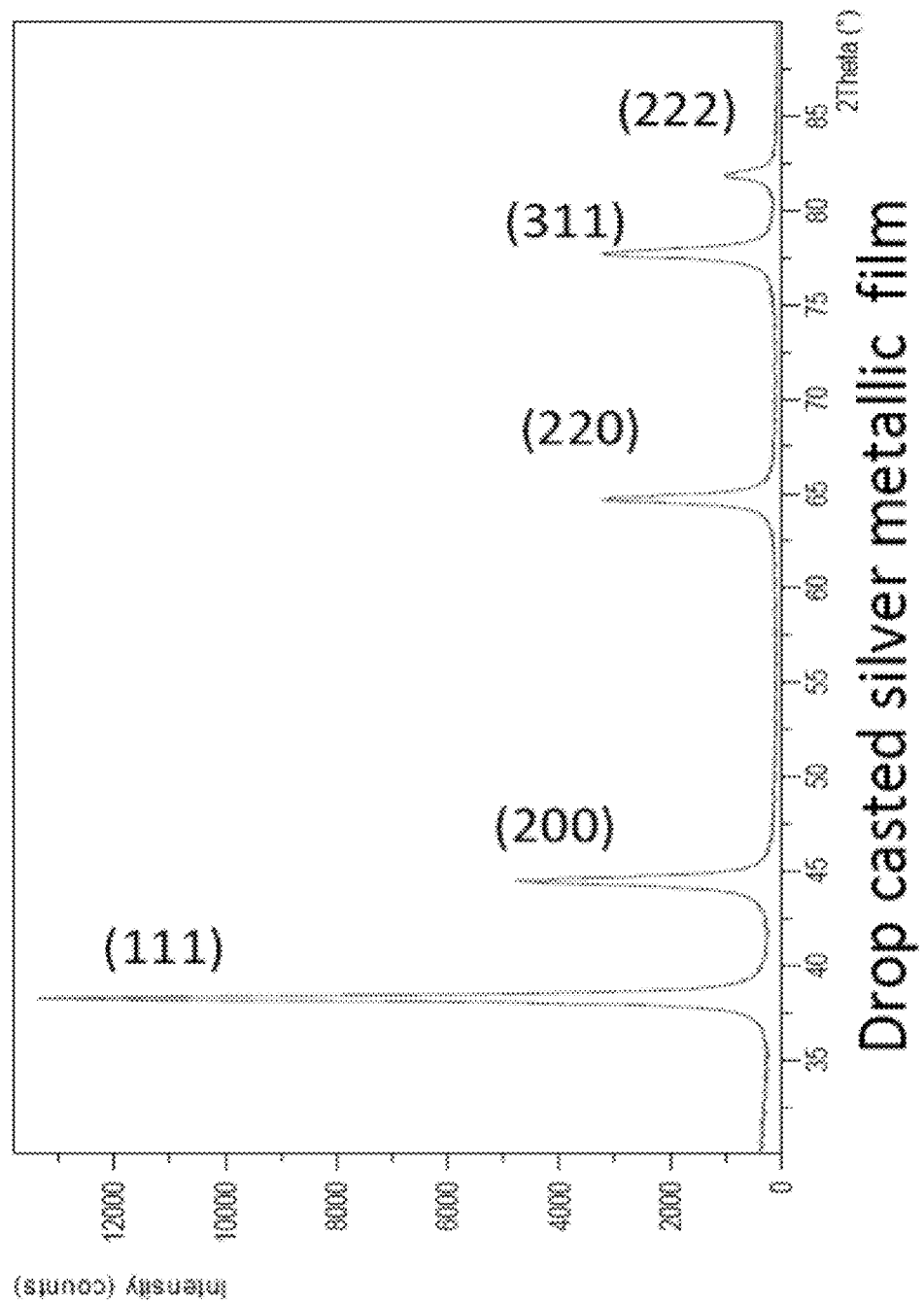
Figure 5C:
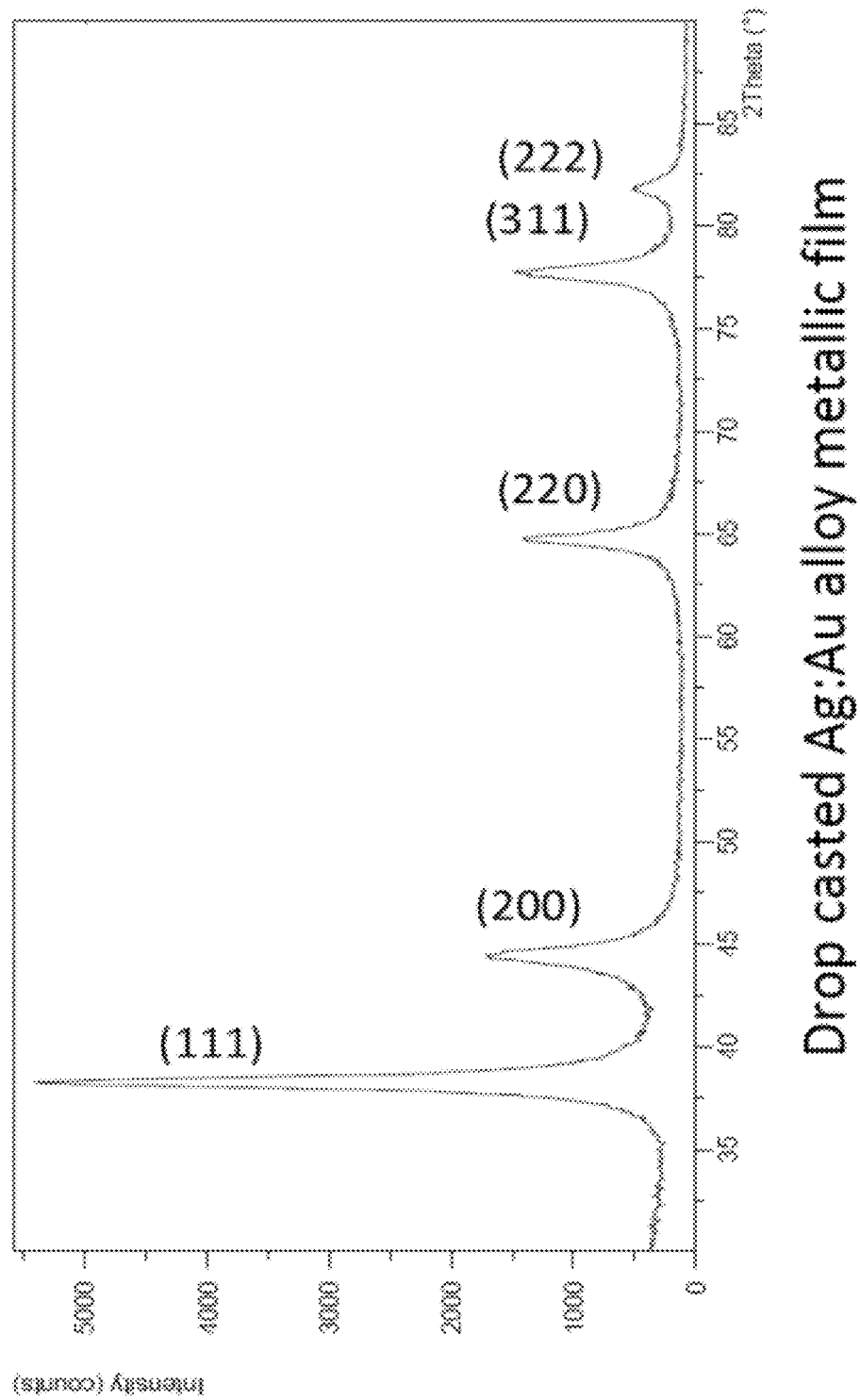

FIGS. 5A, 5B, and 5C illustrate one embodiment, showing structural characterization by PXRD of the resulting metallic alloy films from an ink containing a 50% Ag and 50% Au atomic ratio (5C), as well as the individual metals Ag (5A) and gold (5B). Silver and gold crystallize in face centered cubic (FCC) and have nearly identical lattice constants, thus the diffraction patterns of these metals support the formation of silver and gold crystalline films.

FIGS. 6A and 6B illustrate one embodiment, showing diffraction overlays of Au, Ag and the resulting alloy films from an ink containing a 50% Ag and 50% Au atomic ratio. The overlay plots show shifts of the alloy peaks to areas between the silver and gold peaks. The fact that the alloy shows a single peak, as well as its slightly shifted position, is indicative of a solid solution chemical alloy with the Ag and Au atoms positioned randomly about the FCC lattice. FIG. 6A shows a broader range of peaks compared to FIG. 6B. The higher angle in FIG. 6B provides better resolution. The gold trace is red; the silver trace is blue, and the alloy trace is green.

Example 7

Analysis of Films After Etching

After etching, the films were inspected including determination if any delamination from the substrate occurred.

What is claimed is:

1. A composition comprising:
   at least one first metal complex, wherein the first metal complex comprises a first metal and at least one first ligand and at least one second ligand, different from the first ligand, for the first metal;
   at least one second metal complex, which is different from the first metal complex, and comprises a second metal and at least one first ligand and at least one second ligand, different from the first ligand, for the second metal;
   at least one solvent,
   wherein for the first metal complex the metal is silver, the first ligand is an amine ligand, and the second ligand is a carboxylate ligand, and wherein for the second metal complex the metal is gold, the first ligand is a thioether ligand, and the second ligand is a carboxylate ligand.

2. The composition of claim 1, wherein the two second ligands of the two complexes are the same.

3. The composition of claim 1, wherein the atomic percent of the first metal is about 10% to about 90% and the atomic percent of the second metal is about 10% to about 90% relative to the total metal content.

4. The composition of claim 1, wherein the atomic percent of the first metal is about 20% to about 80% and the atomic percent of the second metal is about 20% to about 80% relative to the total metal content.

5. The composition of claim 1, wherein the solvent is a hydrocarbon.

6. The composition of claim 1, wherein the solvent is an aromatic hydrocarbon.

7. The composition of claim 1, wherein the first and second metal complexes each comprise at least 25 wt. % metal.

8. The composition of claim 1, wherein the first and second metal complexes each comprise at least 50 wt. % metal.

9. The composition of claim 1, wherein the first and second metal complexes each comprise at least 70 wt. % metal.

10. The composition of claim 1, wherein the amount of the first complex and the second complex relative to the total amount of composition is about 500 mg/mL or less.

11. The composition of claim 1, wherein the amount of the first complex and the second complex relative to the total amount of composition is about 250 mg/mL or less.

12. The composition of claim 1, wherein the composition has a viscosity of about 1 cps to about 20 cps.

13. The composition of claim 1, wherein the first metal complex and the second metal complex each comprise only one metal center.

14. The composition of claim 1, wherein the first metal of the first metal complex and the second metal of the second metal complex each are in an oxidation state of (I).

15. The composition of claim 1, wherein the carboxylate ligand of the first metal complex is an alkylcarboxylate ligand.

16. The composition of claim 1, wherein the second metal complex comprises at least one alkylcarboxylate ligand.

17. The composition of claim 1, wherein the composition is totally free of metallic nanoparticles.

18. The composition of claim 1, wherein the first metal complex and the second metal complex each comprise a carboxylate ligand which has eight or fewer carbon atoms.

19. The composition of claim 1, wherein the solvent is a hydrocarbon, and wherein the amount of the first complex and the second complex relative to the total amount of composition is about 500 mg/mL or less.

20. The composition of claim 1, wherein the first metal complex is a silver complex, and the second metal complex is a gold complex, and wherein the amount of the first complex and the second complex relative to the total amount of composition is about 500 mg/mL or less.

21. The composition of claim 1, wherein the first metal complex is a silver complex, and the second metal complex is a gold complex, and wherein the amount of the first complex and the second complex relative to the total amount of composition is about 500 mg/mL or less, and wherein the composition has a viscosity of about 1 cps to about 20 cps.

22. The composition of claim 1, wherein the first metal complex is a silver complex, and the second metal complex is a gold complex, wherein the composition comprises metallic nanoparticles at a level of less than 0.1 wt. %, and wherein the first metal of the first metal complex and the second metal of the second metal complex each are in an oxidation state of (I).

23. The composition of claim 1, wherein the atomic percent of the first metal is about 20% to about 80% and the atomic percent of the second metal is about 20% to about 80% relative to the total metal content, wherein the solvent is a hydrocarbon, and wherein the first and second metal complexes comprise at least 50 wt. % metal.

24. A composition comprising:
   at least one first metal complex, wherein the first metal complex is a neutral silver complex comprising at least two ligands, wherein at least one first ligand is an amine and at least one second ligand is a carboxylate anion;
   at least one second metal complex, which is different from the first metal complex, wherein the second metal complex is a neutral gold complex comprising at least two ligands, wherein at least one first ligand is a thioether ligand and at least one second ligand is the carboxylate anion of the first metal complex;
   at least one organic solvent, and
   wherein the atomic percent of the first metal is about 20% to about 80% and the atomic percent of the second metal is about 20% to about 80% relative to the total metal content.

* * * * *